United States Patent
Inoue

(10) Patent No.: US 7,245,516 B2
(45) Date of Patent: Jul. 17, 2007

(54) LAYOUT METHOD AND COMPUTER PROGRAM PRODUCT

(75) Inventor: Yoshio Inoue, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/362,926

(22) Filed: Feb. 28, 2006

(65) Prior Publication Data

US 2007/0130552 A1 Jun. 7, 2007

(30) Foreign Application Priority Data

Nov. 21, 2005 (JP) ............................. 2005-336279

(51) Int. Cl.
*G11C 5/02* (2006.01)

(52) U.S. Cl. .............. 365/51; 365/189.01; 365/189.04; 365/102

(58) Field of Classification Search ................... 365/51
See application file for complete search history.

(56) References Cited

U.S. PATENT DOCUMENTS 6,882,592 B2 * 4/2005 Noguchi et al. ....... 365/230.03

6,894,926 B2 * 5/2005 Guterman et al. ...... 365/185.03

FOREIGN PATENT DOCUMENTS

| JP | 2002-288253 | 10/2002 |
| JP | 2003-347405 | 12/2003 |
| JP | 2004-55954 | 2/2004 |

* cited by examiner

*Primary Examiner*—Thong Q. Le
(74) *Attorney, Agent, or Firm*—Staas & Halsey LLP

(57) ABSTRACT

A required value of decoupling capacitance is calculated in advance for every functional cell, a virtual cell which has a functional cell, and a decoupling capacitance placing area required for placing the decoupling capacitance with the calculated value is created, the virtual cell is placed on a chip, and the decoupling capacitance cell is subsequently placed in the decoupling capacitance placing area of the virtual cell. A layout method of an integrated circuit and a computer program, in which a decoupling capacitance with an amount required for preventing malfunction caused by a noise can be surely placed, and there is no possibility that the functional cell will need to be replaced due to a shortage of the decoupling capacitance after placing the functional cell can be realized.

16 Claims, 11 Drawing Sheets

F I G. 9
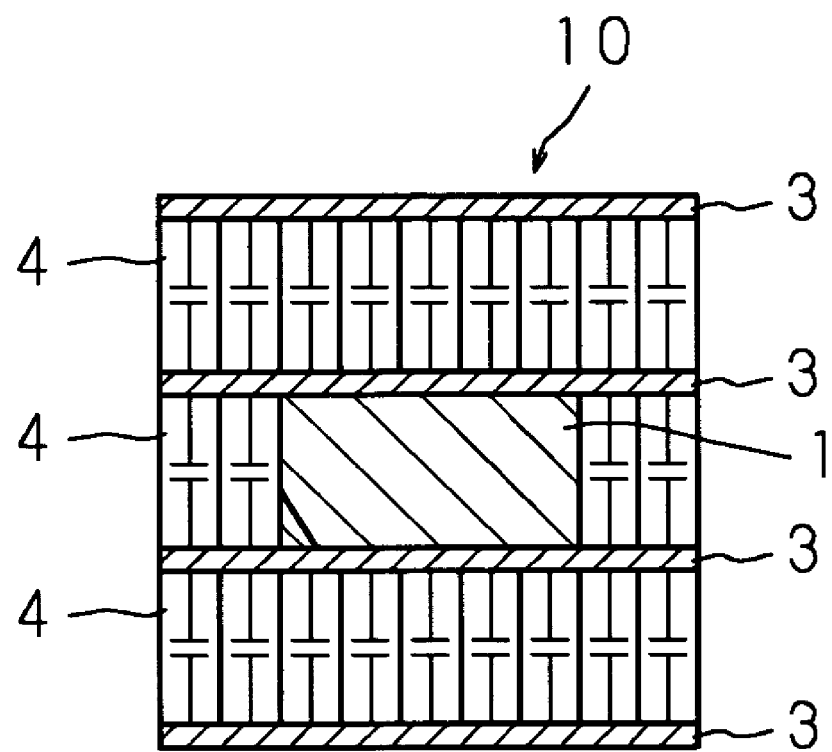

LAYOUT METHOD AND COMPUTER PROGRAM PRODUCT

CROSS-REFERENCE TO RELATED APPLICATIONS

This Nonprofessional application claims priority under 35 U.S.C. §119(a) on patent application No. 2005-336279 filed in Japan on Nov. 21, 2005, the entire contents of which are hereby incorporated by reference.

BACKGROUND OF THE INVENTION

1. Field of the Invention

The present invention relates to a layout method of a semiconductor integrated circuit provided with a decoupling capacitance for preventing malfunction caused by noises of power supply, also relates to a computer program product for causing a computer to execute such a layout method.

2. Description of Related Art

In recent years, microfabrication and high integration of a semiconductor integrated circuit have been achieved, and in connection with this, a lowering in operating voltage, an increase in speed of operating frequency, and the like have been made. For example, a process rule of manufacturing the semiconductor integrated circuit has been reduced to 0.1 μm or less, and in connection with this, an operating voltage of the semiconductor integrated circuit has also been lowered to 1.2 V or less, while the operation frequency has been increased to hundreds of MHz or more. In the semiconductor integrated circuit, however, noises are increased according to an increase in speed of operation frequency, and resistance against the noises is deteriorated by lowering voltage, thus causing a problem that circuit malfunction is easily generated by the noises.

Meanwhile, in order to prevent the circuit malfunction by the noises, there is known a technology of providing a decoupling capacitance between circuit power supplies. Conventionally, a placement of the decoupling capacitances at a CAD stage in a layout design has been performed into free areas where functional cells have not been placed after functional cells, such as flip-flops, logic gate elements, clock buffers, and I/O cells, have been first placed in a chip according to an appropriate rule. In this case, after the functional cells and the decoupling capacitances have been placed, it is necessary to verify whether or not a sufficient amount of decoupling capacitance is placed. As a result of verification, if the decoupling capacitance has not been sufficiently placed, the placement of the functional cell has been needed to be changed so that the free areas for placing the decoupling capacitance might be extended.

According to Japanese Patent Application Laid-Open No. 2004-055954, there is proposed a layout method of a semiconductor integrated circuit, in which a decoupling capacitance required for reducing a noise is estimated in advance, and as a result of that, the required decoupling capacitance is preferentially placed in a corner area which may a dead space of a chip, and a periphery of an I/O cell, and a semiconductor integrated circuit placed in such a method.

Moreover, according to Japanese Patent Application Laid-Open No. 2002-288253, there is proposed a method, in which after functional cells are placed in a chip, the chip is divided into a plurality of areas, and a required decoupling capacitance is determined for every divided area, so that the decoupling capacitance is placed in each of the areas by increasing or reducing each of the areas depending on the required amount of decoupling capacitance.

In the conventional technology for placing the conventional decoupling capacitance, however, as described above, the decoupling capacitance has been placed in free areas after the functional cells have been placed. Meanwhile, in a layout method of a semiconductor integrated circuit described in the aforementioned Japanese Patent Application Laid-Open No. 2004-055954, the decoupling capacitance is intended to be placed in a corner area of the chip, and a periphery an I/O cell. For this reason, since the decoupling capacitance is not necessarily placed near a functional cell which particularly requires the decoupling capacitance, for example a functional cell which becomes a source of power supply noise, such as a flip-flop, a clock buffer, or the like, there is a fear that the decoupling capacitance may not effectively function.

Furthermore, in a conventional art, for example, a method of placing a decoupling capacitance described in the aforementioned Japanese Patent Application Laid-Open No. 2002-288253, after a functional cells are first placed in a chip, a decoupling capacitance is placed. For this reason, when there is a shortage of a free area for placing a decoupling capacitance, it is necessary to correct the result of layout processing in order to secure the free area, so that there is a problem of an increase in time required for layout operations.

BRIEF SUMMARY OF THE INVENTION

The present invention is made in view of the above situation, and thus the present invention aims at providing a layout method of an integrated circuit capable of surely placing a required amount of decoupling capacitance in an optimal position, reducing re-execution of a placement resulting from a shortage of decoupling capacitance, and easily placing a virtual cell when the virtual cell is placed on a chip, and a computer program product for causing a computer to execute such a layout method.

In order to achieve such an object, according to a first aspect of the present invention, there is employed a configuration such that by calculating a required value of decoupling capacitance for every functional cell in advance, a virtual cell which has a placement area required for placing a decoupling capacitance with a calculated value, and a functional cell is created, and after the virtual cell created in such a way is placed in a chip, the decoupling capacitance is placed in the placement area of the virtual cell.

Moreover, another object of the present invention aims at providing a layout method of an integrated circuit capable of surely placing a required amount of decoupling capacitance in an optimal position, and reducing re-execution of a placement resulting from a shortage of decoupling capacitance, and a computer program product for causing a computer to execute such a layout method.

In order to achieve such an object, according to a second aspect of the present invention, there is employed a configuration such that by calculating a required value of decoupling capacitance for every functional cell in advance, a virtual cell which has a decoupling capacitance with a calculated value and a functional cell is created, and the virtual cell created in such a way is placed on a chip.

Still another object of the present invention aims at providing a layout method of an integrated circuit capable of easily creating a virtual cell, and a computer program product for causing a computer to execute such a layout method.

In order to achieve such an object, according to a third aspect of the present invention, there is employed a configuration such that in the aforementioned first or second aspect, by preparing in advance a cell library, in which a decoupling capacitance with a predetermined value or a placement area required for placing the decoupling capacitance with the predetermined value is added to a functional cell, a virtual cell is created so that the decoupling capacitance or the placement area may be reduced according to a required amount of decoupling capacitance.

Still another object of the present invention aims at providing a layout method of an integrated circuit capable of surely providing a virtual cell with a required amount of decoupling capacitance, and a computer program product for causing a computer to execute such a layout method.

In order to achieve such an object, according to a fourth aspect of the present invention, there is employed a configuration such that in the aforementioned first or second aspect, a virtual cell is created so that the decoupling capacitance or the placement area may be added to the functional cell according to a value of the required amount of decoupling capacitance.

Still another object of the present invention aims at providing a layout method of an integrated circuit capable of easily creating a virtual cell, and a computer program product for causing a computer to execute such a layout method.

In order to achieve such an object, according to a fifth aspect of the present invention, there is employed a configuration such that in aforementioned first or second aspects, a unit capacitance cell which has a decoupling capacitance with a constant value or a unit area with a constant size is prepared in advance, and a virtual cell is created by adding or reducing the unit capacitance cell or the unit area.

The first aspect of the layout method of the integrated circuit in accordance with the present invention is a layout method for reading data of a plurality of functional cells from a cell library stored in a storage device to place the functional cells on an integrated circuit in order to realize a circuit configuration stored in a storage device as an integrated circuit, and is characterized by comprising: a first step of reading data of a functional cell required for realizing the circuit configuration stored in the storage device from the cell library; a second step of calculating a value of decoupling capacitance required for the functional cell whose data are read from the cell library at the first step; a third step of creating a virtual cell which has the functional cell whose data are read from the cell library at the first step, and a decoupling capacitance placing area required for placing the decoupling capacitance whose value is calculated at the second step; a fourth step of repeating the first through third steps until data of all functional cells required for realizing the circuit configuration stored in the storage device are read from the cell library; a fifth step of placing all of the virtual cells created at the third step on the integrated circuit; and a sixth step of placing the decoupling capacitance in the decoupling capacitance placing area of each of all virtual cells placed on the integrated circuit at the fifth step.

In the first aspect of the aforementioned layout method of the integrated circuit in accordance with the present invention, the required value of decoupling capacitance is calculated for every functional cell in advance, and the virtual cell which has the placement area required for placing the decoupling capacitance with the calculated value, and the functional cell is created. After the virtual cell created in such a way is placed on the chip, the decoupling capacitance is placed in the placement area of the virtual cell. Accordingly, since the area for placing the required decoupling capacitance is secured in the virtual cell in advance, when the virtual cell is placed, the decoupling capacitance is also placed surely. In addition, creating the virtual cell which has the functional cell and the placement area decreases the amount of data of the virtual cell, thus allowing the virtual cell to be easily placed.

As a result, according to the first aspect of the layout method of the integrated circuit in accordance with the present invention, since a situation of shortage of the decoupling capacitance may not occur, it will not be necessary to correct the result of layout processing. For this reason, a reduction in time required for the layout design of the integrated circuit can be made. Moreover, since the amount of data of the virtual cell is reduced, the virtual cell can be easily placed, so that a reduction in time required for the layout design of the integrated circuit can be made also from this aspect.

The second aspect of the layout method of the integrated circuit in accordance with the present invention is a layout method for reading data of a plurality of functional cells from a cell library stored in a storage device to place the functional cells on an integrated circuit in order to realize a circuit configuration stored in a storage device as an integrated circuit, and is characterized by comprising: a first step of reading data of a functional cell required for realizing the circuit configuration stored in the storage device from the cell library; a second step of calculating a value of decoupling capacitance required for the functional cell whose data are read from the cell library at the first step; a third step of creating a virtual cell which has the functional cell whose data are read from the cell library at the first step, and a decoupling capacitance whose value is calculated at the second step; a fourth step of repeating the first through third steps until data of all functional cells required for realizing the circuit configuration stored in the storage device are read from the cell library; and a fifth step of placing all of the virtual cells created at the third step on the integrated circuit.

In the second aspect of the aforementioned layout method of the integrated circuit in accordance with the present invention, a required value of decoupling capacitance is calculated for every functional cell in advance, and the virtual cell which has the decoupling capacitance with the calculated value and the functional cell is created. The virtual cell created in such a way is then placed on the chip. Accordingly, since the decoupling capacitance required for each of the virtual cells is included in the virtual cell in advance, when the virtual cell is placed, the decoupling capacitance is also secured surely.

As a result, according to the second aspect of the layout method of the integrated circuit in accordance with the present invention, since a situation of shortage of the decoupling capacitance may not occur, it will not be necessary to correct the result of layout processing. For this reason, a reduction in time required for the layout design of the integrated circuit can be made.

The third aspect of the layout method of the integrated circuit in accordance with the present invention is, based on the first or second aspects, characterized by further comprising the step of previously creating the cell library including a functional cell to which a decoupling capacitance with a predetermined value or a decoupling capacitance placing area with a predetermined size is added to store the created cell library in the storage device, wherein the third step of creating the virtual cell creates a virtual cell by reducing the decoupling capacitance with the predetermined value or the decoupling capacitance placing area with the predetermined size which is added to the functional cell included in the cell library, according to the value of decoupling capacitance calculated at the second step.

In the third aspect of the aforementioned layout method of the integrated circuit in accordance with the present invention, the data in which the decoupling capacitance with the predetermined value, or the placement area with the predetermined size required for placing the decoupling capacitance with the predetermined value is added to the functional cell are prepared as the cell library in advance. Accordingly, the virtual cell is created by reducing the decoupling capacitance with the predetermined value or the placement area with the predetermined size according to a required amount of decoupling capacitance. Since creation processing of such a virtual cell is processing of only reducing the decoupling capacitance, the virtual cell is easily created.

As a result, according to the third aspect of the layout method of the integrated circuit in accordance with the present invention, the creation processing of the virtual cell is the processing of only reducing the decoupling capacitance or the placement area. For this reason, since the virtual cell can be easily created, a reduction in time required for the layout design of the integrated circuit can be made.

The fourth aspect of the layout method of the integrated circuit in accordance with the present invention is, based on the first or second aspects, characterized in that the third step of creating the virtual cell creates a virtual cell by adding a decoupling capacitance or a decoupling capacitance placing area to the functional cell, according to the value of decoupling capacitance calculated at the second step.

In the fourth aspect of the aforementioned layout method of the integrated circuit in accordance with the present invention, the virtual cell is created by adding the decoupling capacitance or the placement area to the functional cell according to the value of the required amount of decoupling capacitance. Accordingly, the virtual cell provided with a required amount of decoupling capacitance is surely created without necessity of creating a different library in advance.

As a result, according to the fourth aspect of the layout method of the integrated circuit in accordance with the present invention, the virtual cell provided with the required amount of decoupling capacitance or the placement area can be surely created. Moreover, since it is not necessary to create the different library in advance, time and effort in creating the different library is unnecessary, so that a storage region for storing the different library may not be required, either.

The fifth aspect of the layout method of the integrated circuit in accordance with the present invention is, based on the first and second aspects, characterized in that the third step of creating the virtual cell creates a virtual cell by adding or reducing a unit capacitance cell having a decoupling capacitance with a constant value or a unit area required for placing the decoupling capacitance with the constant value.

In the fifth aspect of the aforementioned layout method of the integrated circuit in accordance with the present invention, the virtual cell is created by adding or reducing the unit capacitance cell of the decoupling capacitance with the constant value, or the unit area with the constant size. Accordingly, since the virtual cell is created only by adding or reducing the unit capacitance cell, the virtual cell can be easily created.

As a result, according to the fifth aspect of the layout method of the integrated circuit in accordance with the present invention, since the virtual cell can be easily created, a reduction in time required for the layout design of the integrated circuit can be made.

Incidentally, the first through fifth aspects of the computer program product in accordance with the present invention is for causing a general-purpose computer to execute the first through fifth aspects of the aforementioned layout method of the integrated circuit in accordance with the present inventions. Accordingly, when the first through fifth aspects of the computer program product in accordance with the present invention are implemented into the general-purpose computer, an apparatus which executes the aforementioned first through fifth aspects of the layout method of the integrated circuit in accordance with the present invention may be realized.

The above and further objects and features of the invention will more fully be apparent from the following detailed description with accompanying drawings.

BRIEF DESCRIPTION OF SEVERAL VIEWS OF THE DRAWINGS

FIG. 9 is a schematic diagram illustrating a plane shape of the cell included in the cell library in accordance with a modified embodiment of Embodiment 1 of the present invention;

DETAILED DESCRIPTION OF THE PRESENT INVENTION

Hereinafter, the present invention will be specifically described based on the drawings illustrating embodiments thereof.

Embodiment 1

Figure 1:
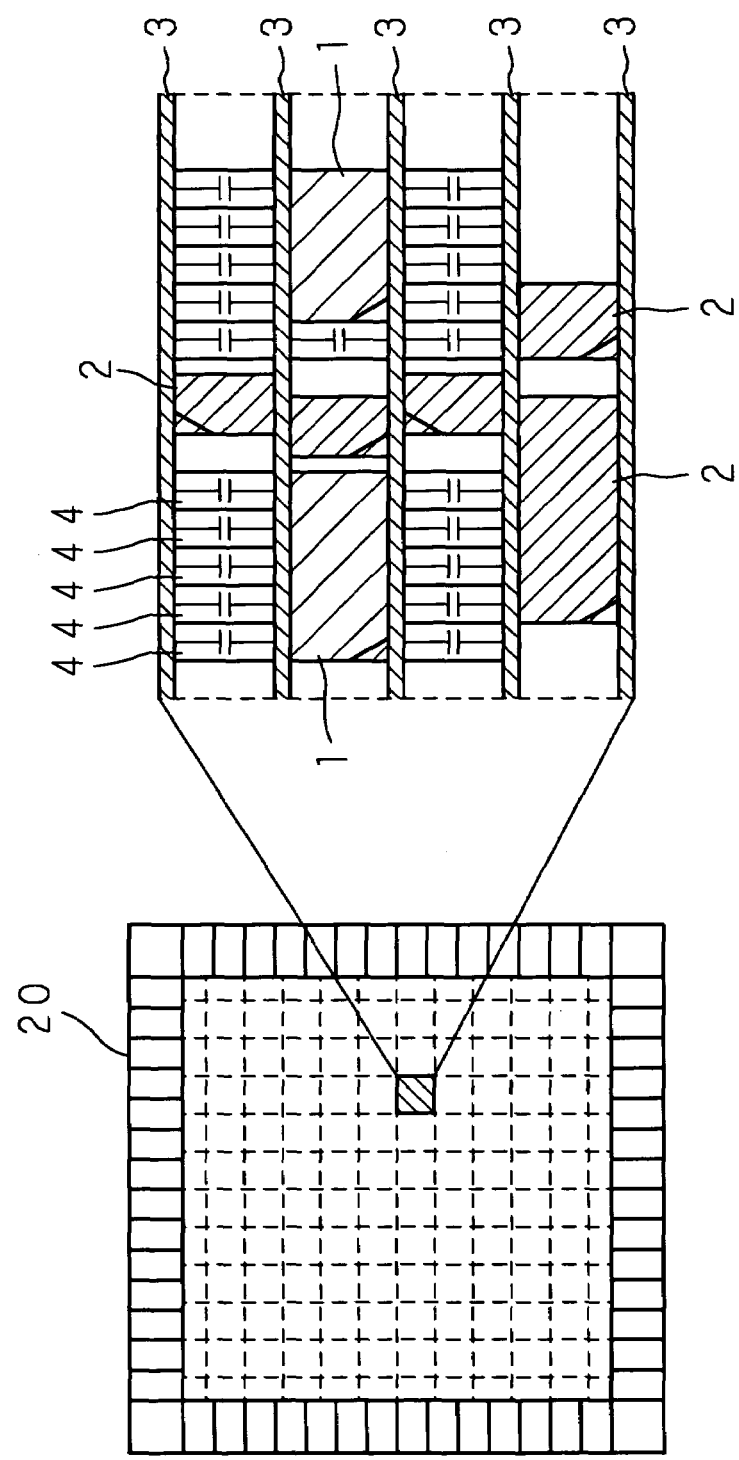
FIG. 1 is a schematic plan view illustrating a layout of a semiconductor integrated circuit to which the present invention is directed.

FIG. 1 is a schematic plan view illustrating a layout of a semiconductor integrated circuit to which the present invention is directed. Here, FIG. 1 also illustrates a schematic plan view of an enlarged portion where a plurality of logic cells are laid out.

In FIG. 1, reference numeral 20 represents a semiconductor integrated circuit. In the semiconductor integrated circuit 20, there are placed a number of logic cells 1 having high possibility to be a source of noises and a number of logic cells 2 having low possibility to be the source of noises on a semiconductor chip. It should be noted that the logic cell 1 having high possibility to be the source of noises includes, for example, a flip-flop, a clock buffer, and the like, which always operates in conjunction with a clock. The logic cell 2 having low possibility to be the source of noises is the cell, such as a NAND element, a NOR element, and the like, which are placed between the flip-flops to execute a logical operation of signals transmitted between the flip-flops.

Moreover, a plurality of global interconnects 3 connected to a power supply wiring or a ground wiring are placed in parallel on the semiconductor integrated circuit 20. Between two of the global interconnects 3, there are placed the logic cells 1 and 2 respectively connected to the global interconnects 3 on their both sides. Additionally, in the peripheral of the logic cell 1 having high possibility to be the source of noises, a plurality of decoupling capacitance cells 4 to reduce the noises are placed. For the decoupling capacitance cell 4, a capacitor composed of, for example, a p-type well formed on a p-type semiconductor substrate and a silicon gate electrode opposed to the p-type well via an insulator film is used.

Figure 2:
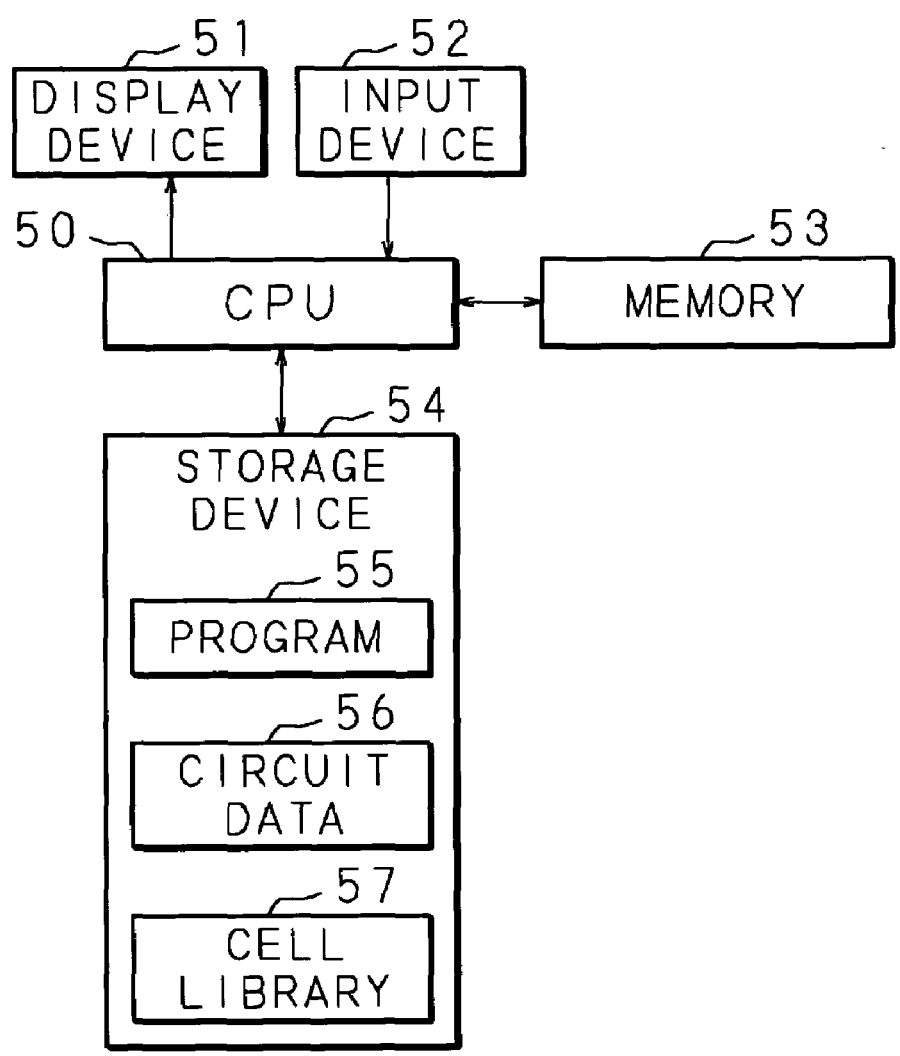
FIG. 2 is a block diagram illustrating a configuration of a computer which executes a layout program in accordance with the present invention.

FIG. 2 is a block diagram illustrating a configuration of a computer executing a layout program included in a computer program product in accordance with the present invention, i.e., an apparatus which executes the layout method of an integrated circuit in accordance with the present invention.

In FIG. 2, reference numeral 50 represents a CPU to perform a central arithmetic processing of the computer. The CPU 50 is connected with a display device 51, an input device 52, a memory 53, and a storage device 54. A CRT display, a liquid crystal display, or the like is available as the display device 51, which displays a layout image based on data provided by the CPU 50. A keyboard, a mouse, and the like are available as the input device 52, which provides an input from a designer to the CPU 50. The memory 53 is a temporary memory device such as an SRAM or a DRAM, which temporarily stores a program to be executed by the CPU 50, data generated during processing of a program, or the like.

The storage device 54 is a non-volatile storage device composed of a hard disk, a flush memory, an optical disk, or the like, where a program 55, circuit data 56, a cell library 57, and the like are stored therein. The program 55 is a layout program to perform a layout processing of the semiconductor integrated circuit 20 based on the circuit data 56. Incidentally, the processing performed based on the program 55 will be hereinafter described in detail. The circuit data 56 is data for recording a configuration of a circuit, whose operational verification, timing verification, and the like have been completed, and which is a target of the layout processing according to the present invention, wherein the circuit data 56 is stored in the storage device 54 in the format of a so-called net list. The cell library 57 stores, in the library format, planar shape data of the respective cells, such as the flip-flop, the NAND element, and the NOR element placed on the semiconductor integrated circuit 20. The program 55 performs the layout processing by reading the planar shape of the respective cells from the cell library 57.

Figure 3:
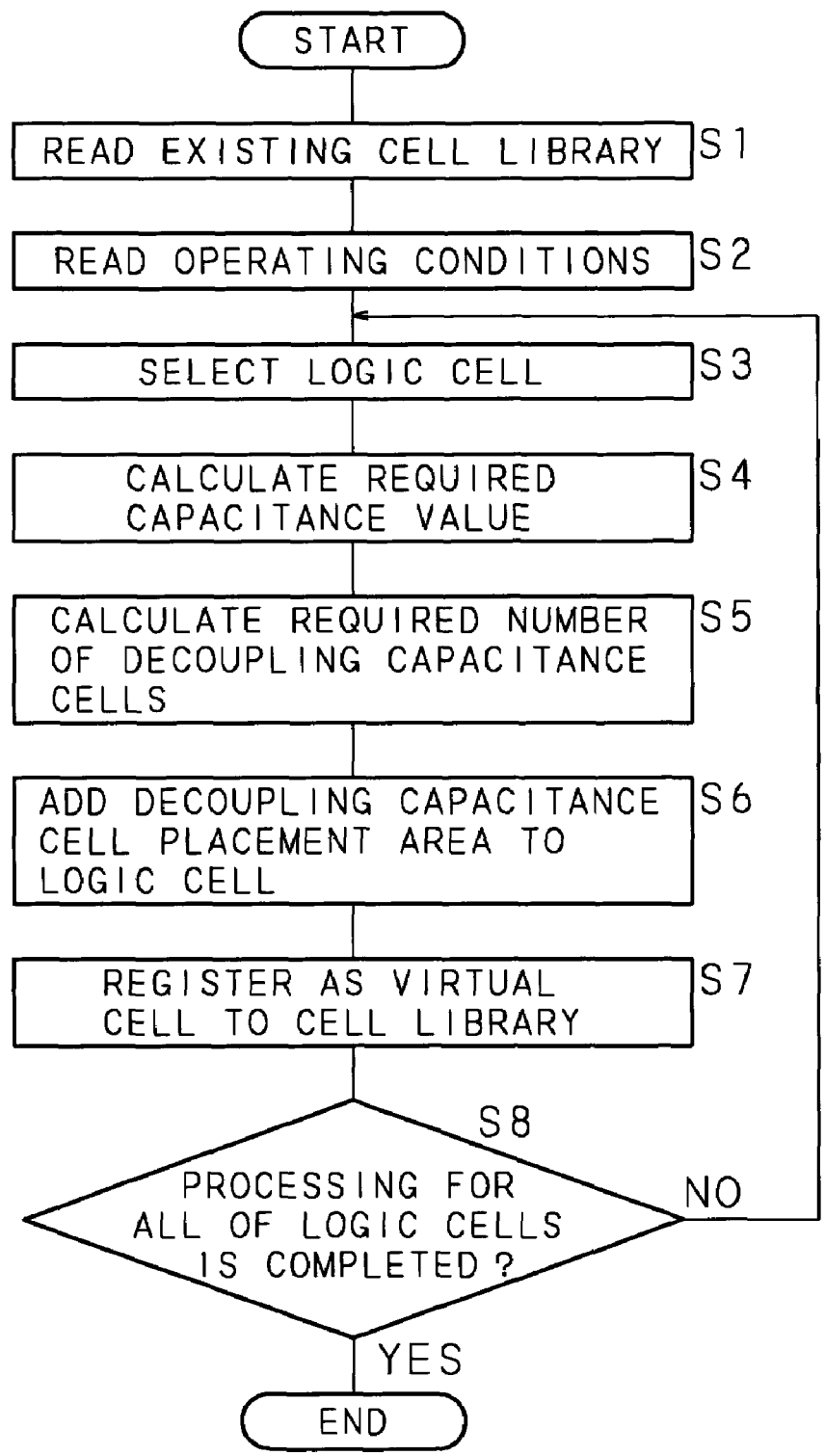
FIG. 3 is a flow chart illustrating a procedure of a creation process of a cell library according to Embodiment 1 of the present invention.

FIG. 3 is a flowchart illustrating a procedure of creation processing of the cell library 57 according to Embodiment 1 of the present invention. Specifically, it illustrates the processing for creating the cell library 57, by modifying an existing cell library, required for the CPU 50 to perform the layout processing according to the program 55 based on a layout method in accordance with the present invention.

Figure 4A:
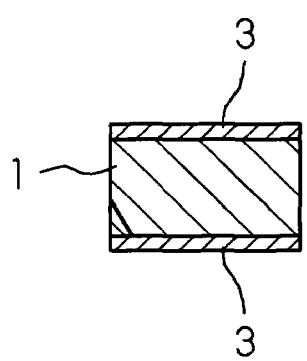
FIG. 4A and FIG. 4B are schematic diagrams illustrating a process for forming a plane shape of a cell included in the cell library according to Embodiment 1 of the present invention.
Figure 4B:
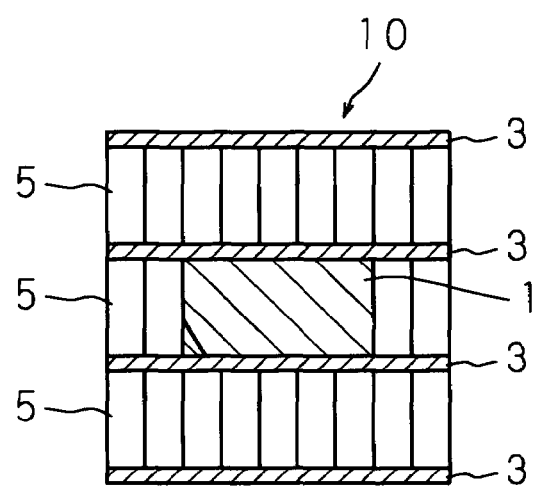

Additionally, FIG. 4A and FIG. 4B are schematic views illustrating a process for forming the planar shape of the cell included in the cell library 57 according to Embodiment 1 of the present invention. It should be noted that FIG. 4A and FIG. 4B illustrate the process for forming the planar shape of a single cell. Incidentally, the creation of the cell library 57 is automatically performed by executing a library creating function included in the program 55 by the CPU 50.

The creation of the cell library 57 is started by reading the existing cell library (step S1). In the existing cell library, as shown in FIG. 4A, there are registered the planar shapes of the plurality of logic cells 1 and 2 each including the two global interconnects 3 and 3 (only the logic cell 1 is shown in FIG. 4A and FIG. 4B). According to a conventional layout program, the layout processing has been performed based on such planar shapes registered in the cell library.

Next, operating conditions of the semiconductor integrated circuit 20 to be created using the cell library 57 are read (step S2). The operating conditions include an operating frequency, a power supply voltage, noise tolerance, and the like of the semiconductor integrated circuit 20 to be created using the cell library 57, where the operating conditions are to be previously determined by the designer. The reading of the operating conditions is performed by reading a file describing the operating conditions preliminarily prepared by the designer, or by directly reading values inputted by the designer through the input device 52. For the operating conditions to be read at this time, the strictest operating conditions among the operating conditions which assumingly operate the semiconductor integrated circuit 20 created by the cell library 57 are applied.

Subsequently, the single logic cell 1 is selected among the plurality of logic cells 1 and 2 included in the existing cell library (step S3), and the processing is started with respect to the selected logic cell 1. First, based on the operating conditions read at step S2, a capacitance value Cd of the decoupling capacitance required for the logic cell 1 selected at step S3 is calculated (step S4). The required capacitance value Cd of the decoupling capacitance is calculated by the following expression.

$$Cd = \frac{P}{f \cdot vdd \cdot \Delta v} - \beta \times Scell \quad (1)$$

Here, in expression (1), f is operating frequency, vdd is power supply voltage, and $\Delta v$ is noise tolerance. These values are the operating conditions read at step S2, and the strictest values are given thereto. Meanwhile, P is electric power consumption to be consumed when the selected logic cell 1 is operated according to the read operating conditions, and is automatically calculated. Scell is an area of the selected logic cell 1, while $\beta$ is a parasitic power supply capacitance per unit area of the selected logic cell 1. Such information is included in the existing cell library read at step S1.

Next, based on the capacitance value Cd of the decoupling capacitance calculated by expression (1), a required number Nd of the decoupling capacitance cells 4 is calculated (step S5). The decoupling capacitance cell 4 is provided by placing each of capacitors having the same capacitance value in a certain region, for example, a region with an area where one minimum NAND element can be placed. As a result, by placing the decoupling capacitance for each of fixed regions, the layout processing of the semiconductor integrated circuit 20 can be performed efficiently. The required number Nd of the decoupling capacitance cells 4 is calculated by the following expression (2).

$$Nd = \frac{Cd}{Cn} \quad (2)$$

Here, in expression (2), Cn is capacitance value of the single decoupling capacitance cell 4. Additionally, since the required number Nd of the decoupling capacitance cells 4 is integer, the calculation result is rounded out to make it integer when it becomes a decimal number.

Next, according to the required number Nd of the decoupling capacitance cells 4, a placement area 5 (decoupling capacitance cell placement area 5) for placing the decoupling capacitance cell 4 is added in the periphery of the logic cell 1 which is previously selected (step S6). At this time, a position where the decoupling capacitance placement area 5 is added to the logic cell 1 is determined according to predetermined priorities, priorities specified by the designer at step S6, or the like. For example, by determining the priorities for the respective sides of the logic cell 1 having the generally rectangular shape by the designer, the decoupling capacitance placement area 5 is added to the side of the higher priority. Additionally, while the decoupling capacitance placement area 5 is preferably added so that the shape of the whole cell after the addition becomes generally rectangular, the cell may have other shapes, for example, a generally L-shape or a generally cross shape. FIG. 4B illustrates the logic cell 1 after the decoupling capacitance placement area 5 is added thereto. In this example, the 22 decoupling capacitance placement areas 5 are provided surrounding the logic cell 1. It should be noted that the global interconnect 3 for the decoupling capacitance cell 4 is also added.

Next, the logic cell 1 to which the decoupling capacitance placement area 5 is added is registered in the cell library 57 as a single virtual cell 10 (step S7). According to the procedure described above, since the processing for the single logic cell 1 is completed, it is checked whether or not the processing is completed for all of the logic cells 1 included in the existing cell library (step S8). As a result, when the unprocessed logic cell 1 exists (S8: NO), the procedure returns to step S3, so that the unprocessed logic cell 1 is selected for addition processing of the decoupling capacitance placement area 5 to be performed in a manner similar to that described above. When the processing is completed for all of the logic cells 1 (S8: YES), the creation processing of the cell library 57 is completed. It should be noted that the addition processing of the decoupling capacitance placement area 5 is not performed to the logic cell 2 which does not require the decoupling capacitance, so that the logic cell 2 might be only copied from the existing cell library to the new cell library 57.

Figure 5:
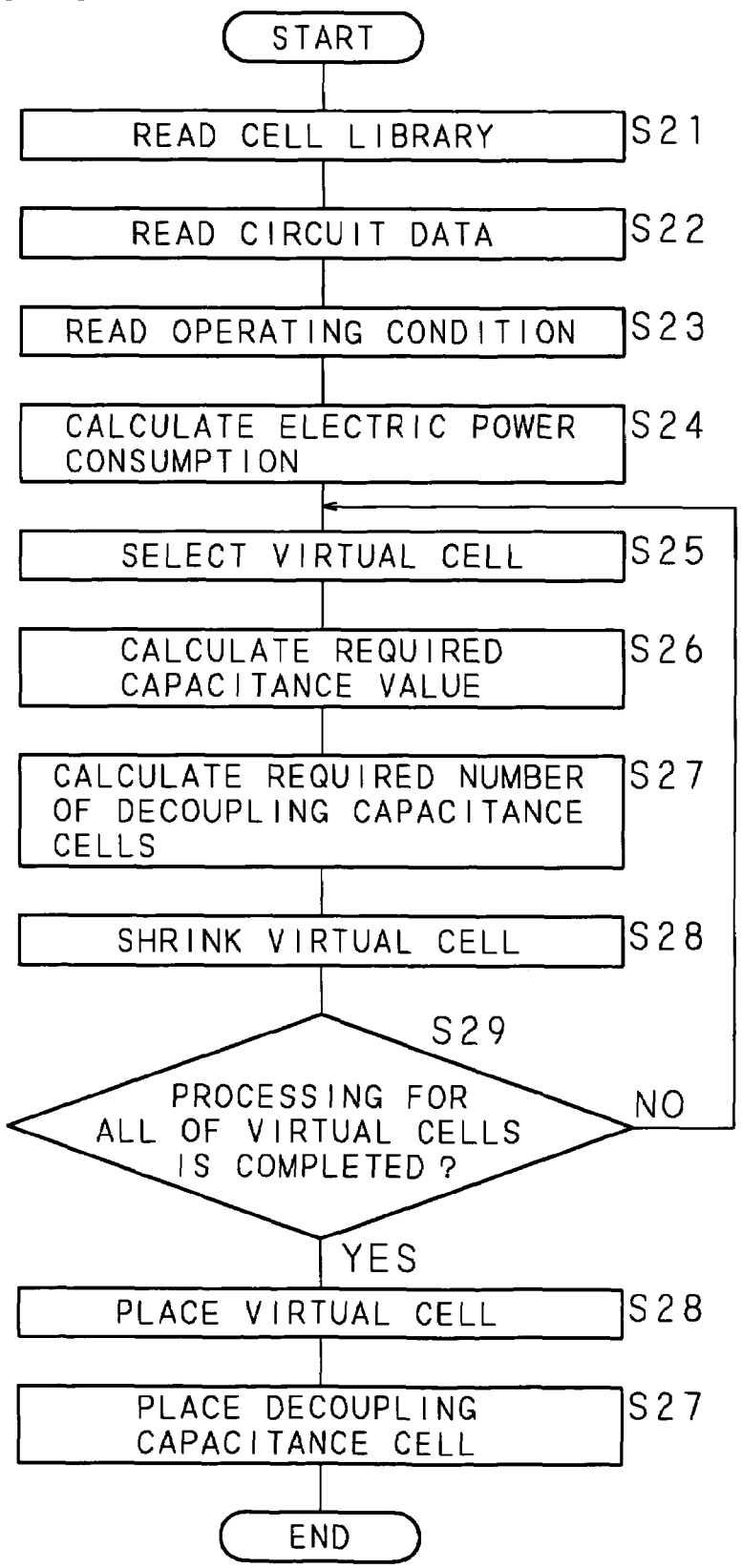
FIG. 5 is a flow chart illustrating a procedure of a layout process executed by using the cell library in accordance with Embodiment 1 of the present invention.

FIG. 5 is a flowchart illustrating procedure of the layout processing performed using the cell library 57 according to Embodiment 1 of the present invention. It is needless to say that this processing is performed by the CPU 50 according to the program 55.

The layout processing is started by reading the cell library 57 from the storage device 54 (step S21). Next, the circuit data 56 of the semiconductor integrated circuit 20 to be laid out is read from the storage device 54 (step S22), and the operating conditions are further read therefrom (step S23). The reading of the operating conditions is performed by reading the file describing the operating conditions preliminarily prepared by the designer, or by directly reading the values inputted by the designer using the input device 52. For the operating conditions to be read at this case, the strictest operating conditions among the conditions which actually operate the semiconductor integrated circuit 20 of the circuit data 56 is applied.

Next, based on the cell library 57, the circuit data 56 and the operating conditions which have been read, the electric power consumption to be consumed by the respective cells included in the cell library 57 is calculated (step S24). At this time, by calculating the electric power consumption while simulating the operation of the semiconductor integrated circuit 20 using the circuit data 56, the more accurate electric power consumption can be calculated.

Subsequently, a single virtual cell is selected among the plurality of virtual cells 10 included in the cell library 57 (step S25), and the processing with respect to the selected virtual cell 10 is started. First, based on the operating conditions read at step S23 and the electric power consumption calculated at step S24, the capacitance value Cd of the decoupling capacitance required for the selected virtual cell 10 is calculated (step S26). The capacitance value Cd of the decoupling capacitance is calculated by aforementioned expression (1). Subsequently, based on the calculated capacitance value Cd of the decoupling capacitance, the required number Nd of the decoupling capacitance cells 4 is calculated by aforementioned expression (2) (step S27). After the required number Nd of the decoupling capacitance cells 4 is calculated, shrink of the virtual cell 10 is performed based on the calculation result (step S28).

Figure 6A:
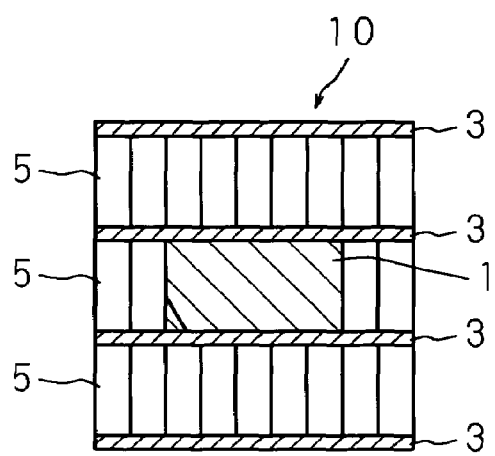
FIG. 6A and FIG. 6B are schematic diagrams illustrating an example of a shrunk virtual cell according to Embodiment 1 of the present invention.
Figure 6B:
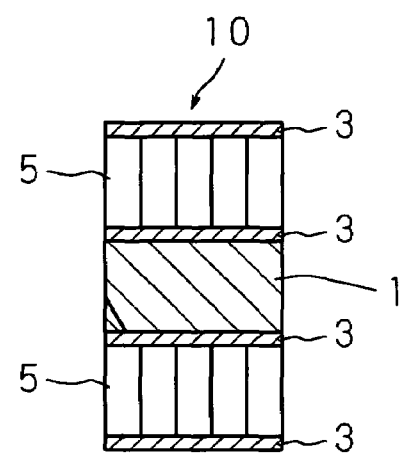

FIG. 6A and FIG. 6B are schematic views of an example of the shrink of the virtual cell 10 according to Embodiment 1 of the present invention. FIG. 6A illustrates the virtual cell 10 before the shrink, while FIG. 6B illustrates the virtual cell 10 after the shrink.

When the virtual cell 10 before the shrink, namely the virtual cell 10 registered in the cell library 57, has a structure where the 22 decoupling capacitance placement areas 5 for placing the decoupling capacitance cells 4 therein are placed in the periphery of the logic cell 1. Accordingly, when the required number Nd of the decoupling capacitance cells 4 is calculated to be 10 at step S27, the shrink is performed by deleting the unnecessary 12 decoupling capacitance placement areas 5. At this time, the deletion of the decoupling capacitance placement area 5 is performed based on a predetermined algorithm or predetermined priorities. By preliminarily determining the algorithm or the priorities so that, for example, the virtual cell 10 after the shrink may be in a shape to be more easily placed, a larger number of the virtual cells 10 can be placed within a limited chip area.

After the shrink of the virtual cell 10 is performed, it is checked whether or not shrink processing is completed for all of the virtual cells 10 (step S29). When the unprocessed virtual cell 10 exists (S29: NO), the procedure returns to step S25 and the unprocessed virtual cell 10 is selected, so that the shrink processing of the selected unprocessed virtual cell 10 is performed in a manner similar to that described above. When the shrink processing is completed for all of the virtual cells 10 (S29: YES), placement of the virtual cell 10 after the shrink, namely the layout processing of the semiconductor integrated circuit 20, is performed (step S30). At this time, the logic cell 2 which does not require the decoupling capacitance cell 4 is also placed along with the virtual cell 10.

Figure 7:
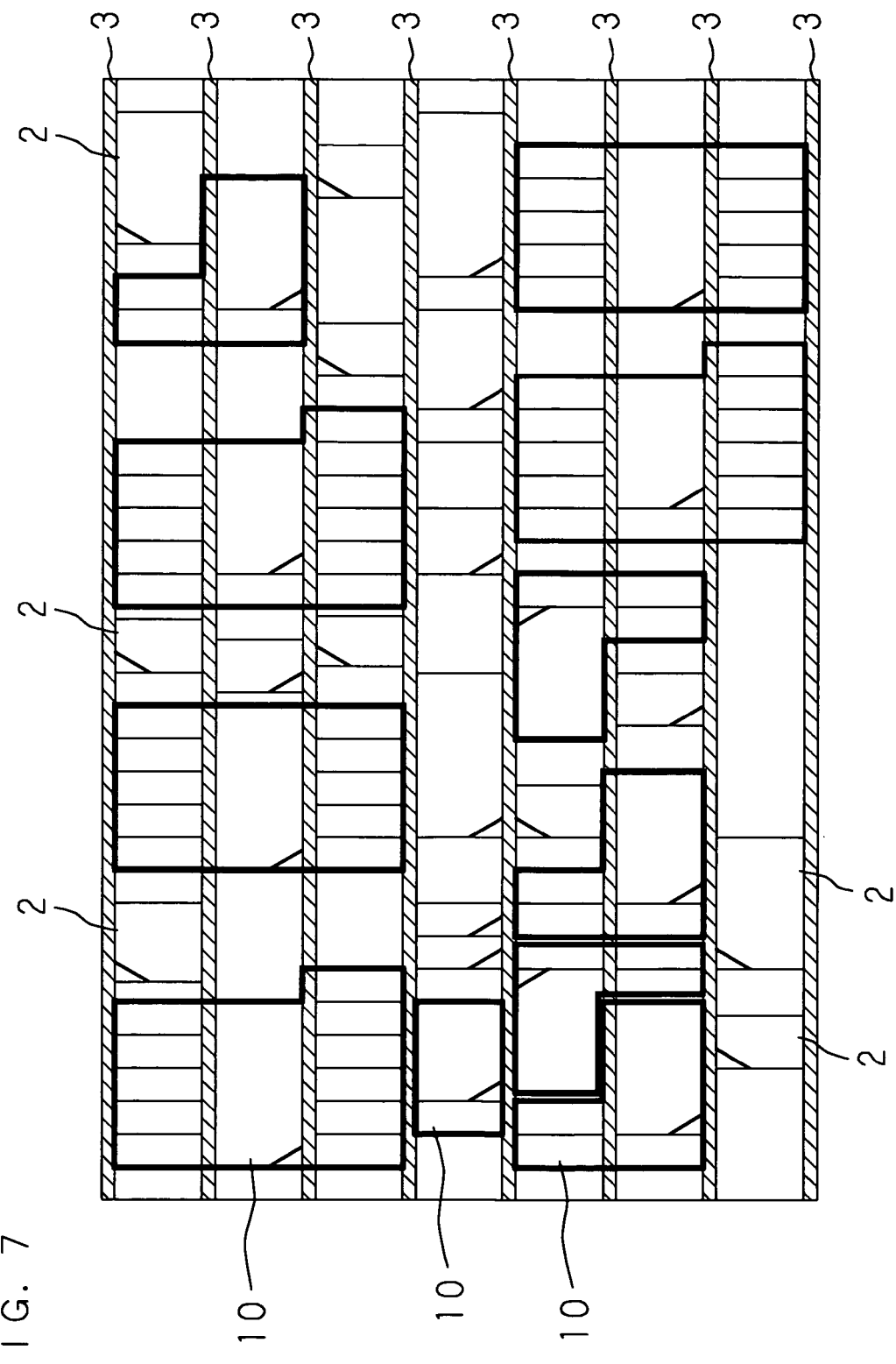
FIG. 7 is a schematic plan view illustrating a placement example of the virtual cell of the semiconductor integrated circuit in accordance with the present invention.

FIG. 7 is a schematic plan view illustrating a placement example of the virtual cells 10 in the semiconductor integrated circuit 20 in accordance with the present invention.

Since the required capacitance value of the decoupling capacitance varies depending on the types of the logic cell 1, the respective virtual cells 10 are different in size and shape. Accordingly, in the semiconductor integrated circuit 20, several kinds of the virtual cells 10 and logic cells 2 are placed as close proximity to each other as possible while securing a space for passing through the wiring (not shown) between the cells.

Next, the decoupling capacitance cell 4 is placed in the decoupling capacitance placement area 5 of the virtual cell 10 (step S31), and the layout processing is completed.

Figure 8:
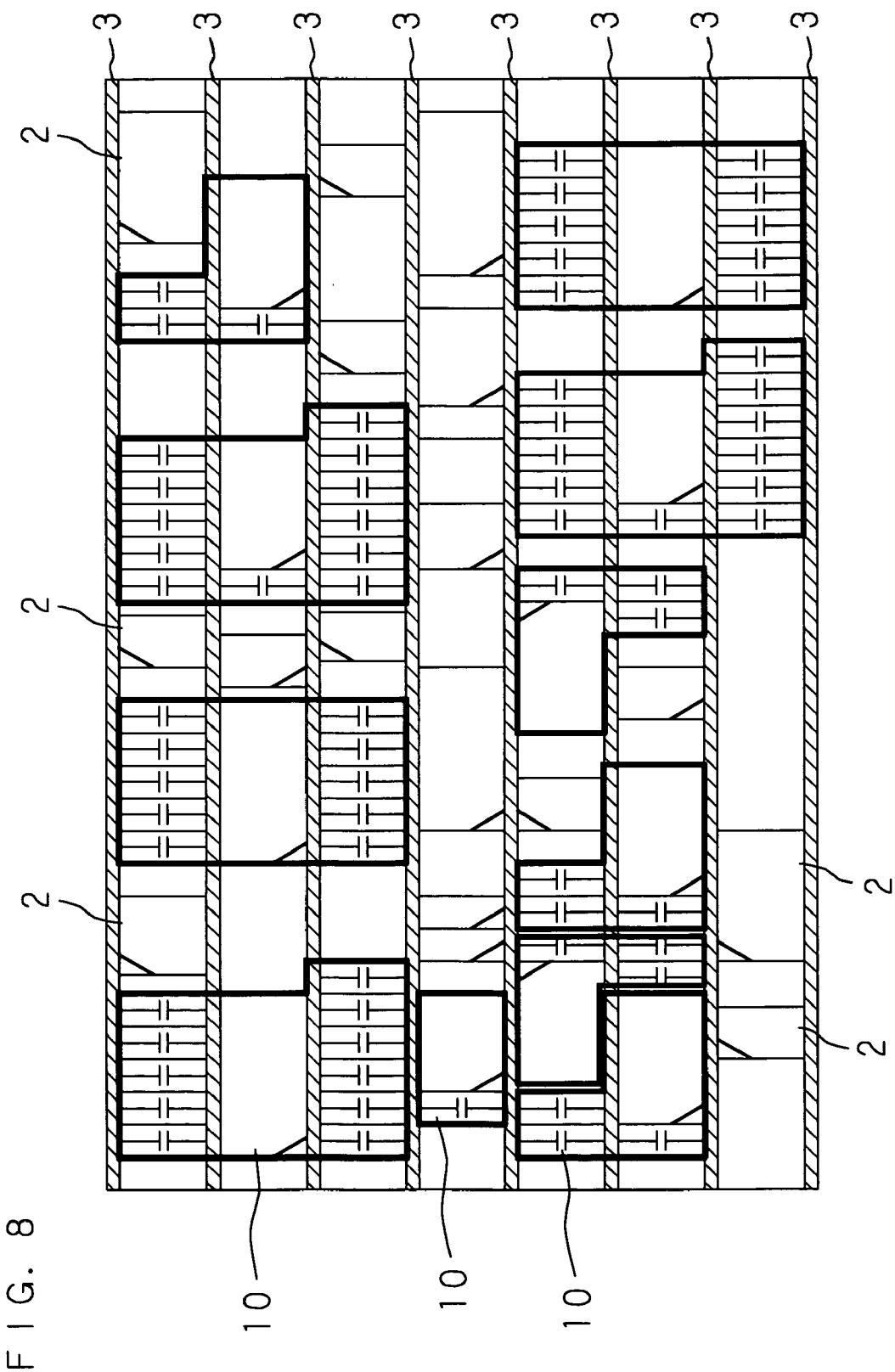
FIG. 8 is a schematic plan view illustrating a configuration after placing a decoupling capacitance cell of the semiconductor integrated circuit in accordance with the present invention.

FIG. 8 is a schematic plan view illustrating a configuration after the decoupling capacitance cells 4 of the semiconductor integrated circuit 20 in accordance with the present invention are placed. The decoupling capacitance cells 4 are placed in the decoupling capacitance placement areas 5 preliminarily provided in the virtual cell 10, respectively. As a result, the decoupling capacitance cell 4 is surely placed in the periphery of the logic cell 1 having high possibility to be the source of noises, allowing the noise to be reduced.

As described above, according to Embodiment 1 of the present invention, the capacitance value of the decoupling capacitance required to suppress the noises of the logic cell 1 is preliminarily calculated, so that the virtual cell 10, wherein the decoupling capacitance placement area 5 for placing the decoupling capacitance cell 4 therein is preliminarily added to the logic cell 1, is created. Additionally, since the layout processing is performed by placing the virtual cell 10 created as described above, the required decoupling capacitance can be surely placed. For this reason, a situation where there is a shortage of the decoupling capacitance after the layout processing is completed, so that necessity to perform the layout processing once again may not occur.

It should be noted that, in Embodiment 1, a configuration that the decoupling capacitance cell 4 is added only to the logic cell 1, such as the flip-flop and the clock buffer is employed. The present invention is not limited thereto, but the decoupling capacitance cell 4 may be added to the logic cell 2, such as the NAND element and the NOR element. Moreover, in Embodiment 1, there is shown an example in which the program 55 for performing the layout processing also has a function to create the cell library 57 as shown in the flowchart in FIG. 3. The present invention is not limited thereto, but a dedicated program for creating the cell library 57 may be prepared separately. Furthermore, in Embodiment 1, there is shown a configuration in which the program 55 performs the calculation of the electric power consumption at step S24 of the flowchart shown in FIG. 5. The present invention is not limited thereto, but a configuration in which the calculation of the electric power consumption is performed by a separate program and only the reading of the calculation result is performed at step S24 may be applied.

Additionally, in Embodiment 1, the operating conditions read at step S2 of the flowchart shown in FIG. 3 are set to be the strictest conditions among the operating conditions which assumingly operate the semiconductor integrated circuit. The present invention is not limited thereto, but the conditions may have a certain margin to the operating conditions which assumingly operate the semiconductor integrated circuit, or may be operating conditions themselves which assumingly operate the semiconductor integrated circuit. Moreover, in Embodiment 1, there is shown a configuration in which the shrink processing of the virtual cell must be performed at steps S24 through S29 of the flowchart shown in FIG. 5. The present invention is not limited thereto, but when the operating conditions read at step S23 are identical to the operating conditions of the cell library read at step S21, there may be employed a configuration in which, by skipping the processing of steps S24 through S29, the placement processing at step S30 is performed without performing the shrink processing of the virtual cell in the cell library.

(Modification)

FIG. 9 is a schematic diagram illustrating the planar shape of the cell included in the cell library 57 according to a modification of Embodiment 1 of the present invention, and FIG. 9 corresponds to FIG. 4B of Embodiment 1. While the decoupling capacitance placement area 5 for placing the decoupling capacitance therein is added in the periphery of the logic cell 1 in FIG. 4B, the decoupling capacitance cell 4 is added in the periphery of the logic cell 1 in FIG. 9.

In order to create the cell library 57 in which the decoupling capacitance cell 4 is added in the periphery of the logic cell 1, instead of the processing for adding the decoupling capacitance placement area 5 to the logic cell 1 at step S6 of the flowchart of the cell library creation processing shown in FIG. 3, processing for adding the decoupling capacitance cell 4 to the logic cell 1 may be performed.

Meanwhile, when the layout processing is performed using the cell library 57 in which the decoupling capacitance cell 4 is added to the periphery of the logic cell 1, it is not required to perform processing to place the decoupling capacitance cell 4 in the decoupling capacitance placement area 5 of the virtual cell 10 at step S31 of the flowchart of the layout processing shown in FIG. 5. Accordingly, in this case, the layout processing is completed by placing the virtual cell 10 at step S30.

As described above, in the modification of Embodiment 1, even when the layout processing is performed after the cell library 57 is created by adding the decoupling capacitance cell 4 to the logic cell 1, the required decoupling capacitance can be surely placed. For this reason, a situation where there is a shortage of the decoupling capacitance after the layout processing is complete does not occur, so that it is not necessary to perform the layout processing again, either.

Embodiment 2

In Embodiment 1 described above, the cell library 57 including the virtual cell 10 is created in advance, and then the shrink of the virtual cell 10 is performed at the layout processing. In Embodiment 2, however, the cell library 57 is not created in advance, but the virtual cell 10 is created by adding the decoupling capacitance placement area 5 to the logic cell 1 at the layout processing.

Figure 10:
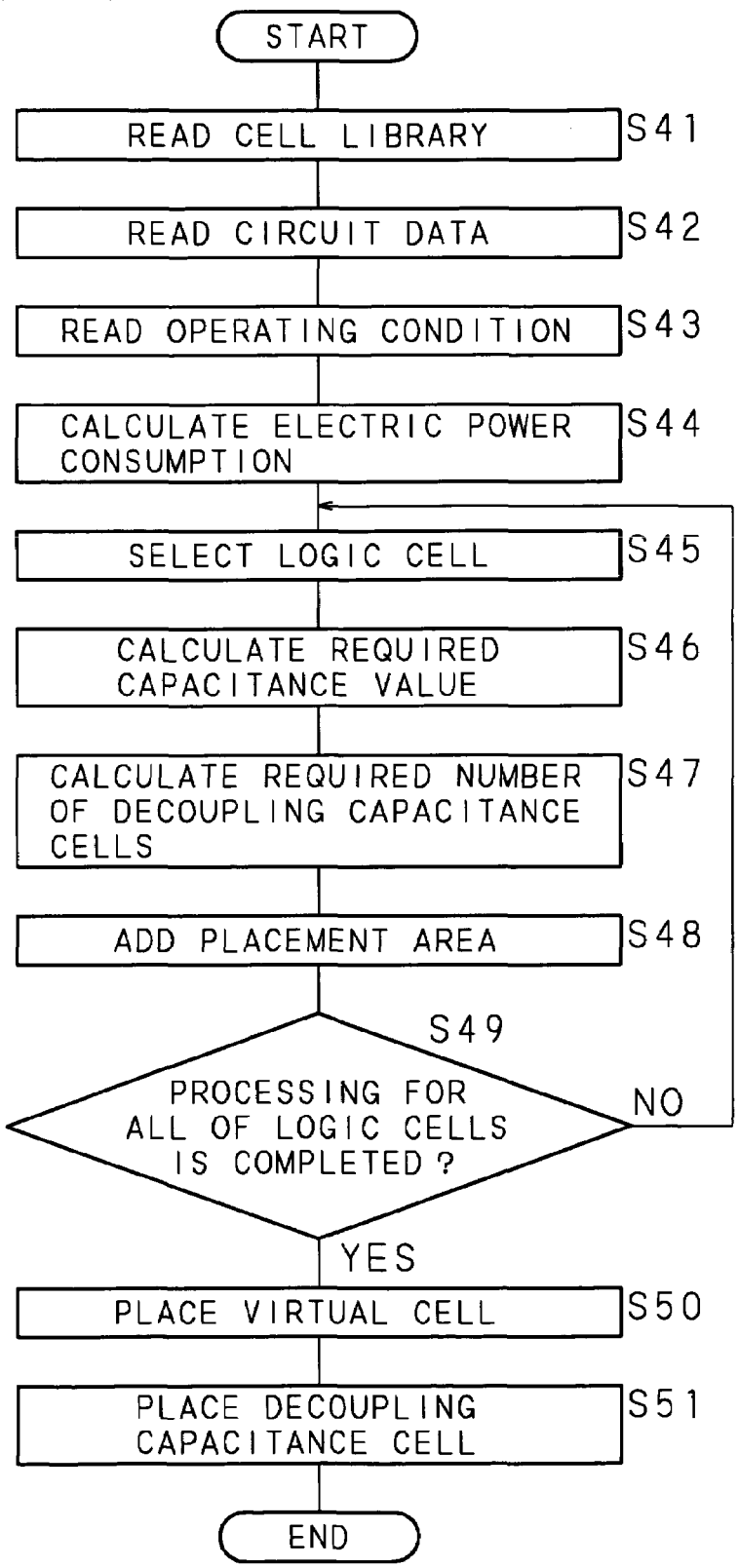
FIG. 10 is a flow chart illustrating a procedure of a layout process according to Embodiment 2 of the present invention.

FIG. 10 is a flowchart illustrating the procedure of the layout processing according to Embodiment 2 of the present invention. It is needless to say that the processing is performed by the CPU 50 according to the program 55.

The layout processing of Embodiment 2 is started by reading the cell library from the storage device 54 (step S41). The cell library read at this time is not the cell library 57 including the virtual cell 10, but the existing cell library to which the planar shapes of only the logic cells 1 and 2 are registered. Next, from the storage device 54, the circuit data 56 of the semiconductor integrated circuit 20 to be laid out is read (step S42), and the operating conditions are further read (step S43). The operating conditions to be read at this time are the strictest operating conditions among the conditions which actually operate the semiconductor integrated circuit 20 of the circuit data 56. After the reading processing, based on the cell library 57, the circuit data 56 and the operating conditions which are read, the electric power consumption to be consumed by the respective cells 1 and 2 is calculated while simulating the operation of the semiconductor integrated circuit 20 (step S44).

Next, the single logic cell is selected among the plurality of logic cells 1 included in the cell library (step S45), and the processing with respect to the selected logic cell 1 is started. First, based on the operating conditions and the electric power consumption, the capacitance value Cd of the decoupling capacitance required for the selected logic cell 1 is calculated by aforementioned expression (1) (step S46), and based on the calculated capacitance value Cd of the decoupling capacitance, the required number Nd of the decoupling capacitance cells 4 is then calculated by aforementioned expression (2) (step S47). After the required number Nd of the decoupling capacitance cells 4 is calculated, the decoupling capacitance placement area 5 for placing the decoupling capacitance cell 4 therein is added to the logic cell 1 based on the calculation result (step S48), so that the virtual cell 10 is created.

Figure 11A:
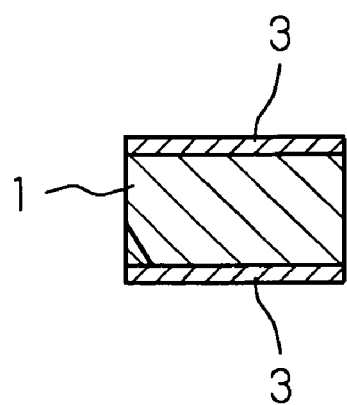
FIG. 11A and FIG. 11B are schematic diagrams illustrating an example of creating the virtual cell according to Embodiment 2 of the present invention.
Figure 11B:
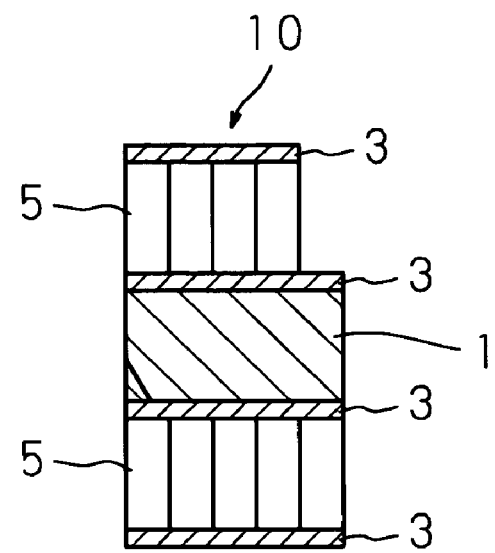

FIG. 11A and FIG. 11B are schematic diagrams illustrating an example of creating the virtual cell 10 according to Embodiment 2 of the present invention. FIG. 11A illustrates the single logic cell 1, while FIG. 11B illustrates the virtual cell 10 in which the decoupling capacitance placement area 5 is added to the logic cell 1. The example shown in FIG. 11B is an example in which the required number Nd of the decoupling capacitance cells 4 is calculated to be 9 at step S47, wherein the 9 decoupling capacitance placement areas 5 are added in the periphery of the logic cell 1. At this time, the addition of the decoupling capacitance placement area 5 is performed based on a predetermined algorithm or priorities. By preliminarily determining the algorithm or the priorities so that, for example, the virtual cell 10 after the addition of the decoupling capacitance placement area 5 may be in a shape, such as a square or a rectangle, to be more easily placed, a larger number of the virtual cells 10 can be placed within a limited chip area.

After the decoupling capacitance placement area 5 is added to the logic cell 1, it is checked whether or not the addition processing of the decoupling capacitance placement area 5 is completed for all of the logic cells 1 (step S49). When the unprocessed logic cell 1 exists (S49: NO), the procedure returns to step S45, and the unprocessed logic cell 1 is selected, so that the addition processing of the decoupling capacitance placement area 5 for the selected logic cell 1 is performed in a manner similar to that described above.

When the addition processing of the decoupling capacitance placement area 5 is completed for all of the logic cells 1 (S49: YES), the placement of the virtual cell 10 created by adding the decoupling capacitance placement area 5 to the logic cell 1, namely the layout processing of the semiconductor integrated circuit 20, is performed (step S50). At this time, the logic cell 2 which does not require the decoupling capacitance cell 4 is also placed along with the virtual cell 10. Next, the decoupling capacitance cell 4 is placed in the decoupling capacitance placement area 5 of the virtual cell 10 (step S51), and the layout processing is completed.

As described above, in Embodiment 2, even when the virtual cell 10 is created by adding the decoupling capacitance placement area 5 for placing the decoupling capacitance cell 4 to the logic cell 1 at the layout processing, the required decoupling capacitance can be surely placed in a manner similar to that of Embodiment 1. For this reason, a situation where there is a shortage of the decoupling capacitance after the layout processing is complete does not occur, so that it is not necessary to perform the layout processing again.

It should be noted that, in a manner similar to that of the modification of Embodiment 1, also in Embodiment 2, when the virtual cell 10 is created, the decoupling capacitance placement area 5 is not added to the logic cell 1, but the decoupling capacitance cell 4 might be added to the logic cell 1.

Incidentally, since the other configurations of Embodiment 2 are similar to those of the aforementioned Embodiment 1, the same reference numerals are given to the corresponding elements, and the description thereof will be omitted.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A layout method of an integrated circuit for reading data of a plurality of functional cells from a cell library stored in a storage device to place the functional cells on an integrated circuit in order to realize a circuit configuration stored in a storage device as an integrated circuit, comprising:

a first step of reading data of a functional cell required for realizing the circuit configuration stored in said storage device from said cell library;

a second step of calculating a value of decoupling capacitance required for the functional cell whose data are read from said cell library at said first step;

a third step of creating a virtual cell which has the functional cell whose data are read from said cell library at said first step, and a decoupling capacitance placing area required for placing the decoupling capacitance whose value is calculated at said second step;

a fourth step of repeating said first through third steps until data of all functional cells required for realizing the circuit configuration stored in said storage device are read from said cell library;

a fifth step of placing all of the virtual cells created at said third step on the integrated circuit; and a sixth step of placing the decoupling capacitance in the decoupling capacitance placing area of each of all virtual cells placed on the integrated circuit at said fifth step.

2. The layout method of an integrated circuit as set forth in claim 1, further comprising the step of previously creating said cell library including a functional cell to a decoupling capacitance placing area with a predetermined size is added to store the created cell library in said storage device, wherein said third step of creating the virtual cell creates a virtual cell by reducing the decoupling capacitance placing area with said predetermined size which is added to said functional cell included in said cell library, according to the value of decoupling capacitance calculated at said second step.

3. The layout method of an integrated circuit as set forth in claim 1, wherein said third step of creating the virtual cell creates a virtual cell by adding a decoupling capacitance placing area to said functional cell, according to the value of decoupling capacitance calculated at said second step.

4. The layout method of an integrated circuit as set forth in claim 1, wherein said third step of creating the virtual cell creates a virtual cell by adding or reducing a unit area required for placing the decoupling capacitance with the constant value.

5. A layout method of an integrated circuit for reading data of a plurality of functional cells from a cell library stored in a storage device to place said functional cells on an integrated circuit in order to realize a circuit configuration stored in a storage device as an integrated circuit, comprising:

a first step of reading data of a functional cell required for realizing the circuit configuration stored in said storage device from said cell library;

a second step of calculating a value of decoupling capacitance required for the functional cell whose data are read from said cell library at said first step;

a third step of creating a virtual cell which has the functional cell whose data are read from said cell library at said first step, and a decoupling capacitance whose value is calculated at said second step;

a fourth step of repeating said first through third steps until data of all functional cells required for realizing the circuit configuration stored in said storage device are read from said cell library; and a fifth step of placing all of the virtual cells created at said third step on the integrated circuit.

6. The layout method of an integrated circuit as set forth in claim 5, further comprising the step of previously creating said cell library including a functional cell to which a decoupling capacitance with a predetermined value is added to store the created cell library in said storage device, wherein said third step of creating the virtual cell creates a virtual cell by reducing the decoupling capacitance with said predetermined value which is added to said functional cell included in said cell library, according to the value of decoupling capacitance calculated at said second step.

7. The layout method of an integrated circuit as set forth in claim 5, wherein said third step of creating the virtual cell creates a virtual cell by adding a decoupling capacitance to said functional cell, according to the value of decoupling capacitance calculated at said second step.

8. The layout method of an integrated circuit as set forth in claim 5, wherein said third step of creating the virtual cell creates a virtual cell by adding or reducing a unit capacitance cell having a decoupling capacitance with a constant value.

9. A computer program product for controlling a computer so that data of a plurality of functional cells is read from a cell library stored in a storage device to place the functional cells on an integrated circuit in order to realize a circuit configuration stored in said storage device as an integrated circuit, wherein the computer program product comprises:

a computer readable storage medium having computer readable program code means embodied in said medium, said computer readable program code means comprising:

first computer instruction means for reading data of a functional cell required for realizing the circuit configuration stored in said storage device from said cell library;

second computer instruction means for calculating a value of decoupling capacitance required for the functional cell whose data are read from said cell library by said first computer instruction means;

third computer instruction means for creating a virtual cell which has the functional cell whose data are read from said cell library by said first computer instruction means, and a decoupling capacitance placing area required for placing the decoupling capacitance whose value is calculated by said second computer instruction means;

fourth computer instruction means for repeating said first through third computer instruction means until data of all functional cells required for realizing the circuit configuration stored in said storage device are read from said cell library;

fifth computer instruction means for placing all of said virtual cells created by said third computer instruction means on the integrated circuit; and sixth computer instruction means for placing the decoupling capacitance in the decoupling capacitance placing area of each of all virtual cells placed on the integrated circuit by said fifth computer instruction means.

10. The computer program product as set forth in claim 9, said computer readable program code means further comprising computer instruction means for previously creating said cell library including a functional cell to which a decoupling capacitance placing area with a predetermined size is added to store the created cell library in said storage device, wherein said third computer instruction means for creating the virtual cell creates a virtual cell by reducing the decoupling capacitance placing area with said predetermined size which is added to said functional cell included in said cell library, according to the value of decoupling capacitance calculated by said second computer instruction means.

11. The computer program product as set forth in claim 9, wherein said third computer instruction means for creating the virtual cell creates a virtual cell by adding a decoupling capacitance placing area to said functional cell, according to the value of decoupling capacitance calculated by said second computer instruction means.

12. The computer program product as set forth in claim 9, wherein said third computer instruction means for creating the virtual cell creates a virtual cell by adding or reducing a unit area required for placing the decoupling capacitance with the constant value.

13. A computer program product for controlling a computer so that data of a plurality of functional cells is read from a cell library stored in a storage device to place the functional cells on an integrated circuit in order to realize a circuit configuration stored in said storage device as an integrated circuit, wherein the computer program product comprises:

a computer readable storage medium having computer readable program code means embodied in said medium, said computer readable program code means comprising:

first computer instruction means for reading data of a functional cell required for realizing the circuit configuration stored in said storage device from said cell library;

second computer instruction means for calculating a value of decoupling capacitance required for the functional cell whose data are read from said cell library by said first computer instruction means;

third computer instruction means for creating a virtual cell which has the functional cell whose data are read from said cell library by said first computer instruction means, and a decoupling capacitance whose value is calculated by said second computer instruction means;

fourth computer instruction means for repeating said first through third computer instruction means until data of all functional cells required for realizing the circuit configuration stored in said storage device are read from said cell library; and fifth computer instruction means for placing all of the virtual cells created by said third computer instruction means on the integrated circuit.

14. The computer program product as set forth in claim 13, said computer readable program code means further comprising computer instruction means for previously creating said cell library including a functional cell to which a decoupling capacitance with a predetermined value is added to store the created cell library in said storage device, wherein said third computer instruction means for creating the virtual cell creates a virtual cell by reducing the decoupling capacitance with said predetermined value which is added to said functional cell included in said cell library, according to the value of decoupling capacitance calculated by said second computer instruction means.

15. The computer program product as set forth in claim 13, wherein said third computer instruction means for creating the virtual cell creates a virtual cell by adding a decoupling capacitance to said functional cell, according to the value of decoupling capacitance calculated by said second computer instruction means.

16. The computer program product as set forth in claim 13, wherein said third computer instruction means for creating the virtual cell creates a virtual cell by adding or reducing a unit capacitance cell having a decoupling capacitance with a constant value.

* * * * *